United States Patent [19]

D'Arrigo et al.

[11] Patent Number: 5,504,706
[45] Date of Patent: Apr. 2, 1996

[54] LOW VOLTAGE FOWLER-NORDHEIM FLASH EEPROM MEMORY ARRAY UTILIZING SINGLE LEVEL POLY CELLS

[75] Inventors: Iano D'Arrigo, Cannes; Georges Falessi, La Gaude, both of France; Michael C. Smayling, Missouri City, Tex.

[73] Assignee: Texas Instruments Incorporated, Dallas, Tex.

[21] Appl. No.: 135,696

[22] Filed: Oct. 12, 1993

[51] Int. Cl.⁶ .............................. G11C 11/34; H01L 29/68
[52] U.S. Cl. .................. 365/185.18; 257/318; 257/321; 365/185.33; 365/185.06; 365/185.27
[58] Field of Search ................. 365/185; 257/314, 257/315, 316, 318, 317, 321

[56] References Cited

U.S. PATENT DOCUMENTS

| | | | |
|---|---|---|---|
| 4,845,538 | 7/1989 | Hazani | 257/318 |
| 4,970,565 | 11/1990 | Wu et al. | 257/318 |
| 5,089,433 | 2/1992 | Anand et al. | 257/318 X |
| 5,223,731 | 6/1993 | Lee | 257/318 |
| 5,291,047 | 3/1994 | Iwasa | 257/318 |

FOREIGN PATENT DOCUMENTS 357078179  5/1982  Japan .................................. 257/318

*Primary Examiner*—David C. Nelms
*Assistant Examiner*—Son Dinh
*Attorney, Agent, or Firm*—Robert D. Marshall, Jr.; James C. Kesterson; Richard L. Donaldson

[57] ABSTRACT

A memory array (10) is provided with a plurality of Flash EEPROM memory cells (24) that are fabricated with a single level poly process. Each of the transistor cells (24) is fabricated from a single poly layer floating gate (40) that extends between a moat region (30) and an implanted region (80), comprising the control gate of the cell (24). The portion of the floating gate (40) overlying the moat forms a channel region and is separated therefrom by a thin tunnel oxide layer (82) to allow the cell to operate in accordance with Fowler-Nordheim tunneling. The portion of the floating gate (40) disposed over the implanted control gate (80) is separated therefrom by a layer of oxide (84). The implant region (80) is contacted by a contact layer (86) to allow voltage to be applied thereto. The transistor is contained within a P–tank (78) which is disposed at a negative voltage, this tank (78) contained within an N–tank (76), which tank (76) is disposed at a higher voltage. This assures that no conduction occurs from the region (80) to the tank (78) when negative voltages are applied to the control gate. Negative medium voltages and positive medium voltages are utilized to allow the array to be bit programmed without using separate row select transistors.

2 Claims, 4 Drawing Sheets

LOW VOLTAGE FOWLER-NORDHEIM FLASH EEPROM MEMORY ARRAY UTILIZING SINGLE LEVEL POLY CELLS

TECHNICAL FIELD OF THE INVENTION

The present invention pertains in general to an erasable, electrically programmable memory cell (EEPROM) and its related driving circuitry and, more particularly, to a single level poly EEPROM cell utilizing positive and negative voltages for programming thereof.

CROSS REFERENCE TO RELATED APPLICATIONS

The present invention is related to U.S. patent application Ser. No. 08/135,695, copending herewith (Atty. Dkt. No. TI-17311), which is entitled Low Voltage flash EEPROM X-Cell using Fowler-Nordheim Tunneling, U.S. patent application Ser. No. 08/135,813, copending herewith (Atty. Dkt. No. TI-17308), which is entitled Low Voltage flash EEPROM memory cell with merge select transistor and non-staked gate structure, and U.S. Pat. No. 5,432,740.

BACKGROUND OF THE INVENTION

Conventional EEPROMs typically employ three to four transistors, which include a tunnel diode device coupled to the floating gate of the sense transistor to charge the latter and a select or row transistor to activate the cell. The use of three or four transistors to realize a cell substantially limits the size reduction possible for EEPROM arrays. Furthermore, typical EEPROM cells require the application of voltages in excess of 15 volts. This therefore requires special processing to reduce leakage and a larger layout to avoid unwanted field transistor turn-on, i.e., the use of high voltage transistors typically have longer channel lengths, and therefore, significantly larger sizes. This is especially the case with respect to the row transistor, since high voltage is applied to the source during the ERASE mode. The peripheral driving circuitry also requires higher voltage transistors to handle these high voltage driving signals.

In order to program select bits in the Flash EEPROM memory array, the separate select transistor is a required disadvantage to this separate transistor in that it increases the size of the memory array and does not allow for asymmetrical layout. Therefore, the separate select transistor does allow isolation of non-selected transistors within the same row as a selected cell. Further, whenever a select transistor is combined with a Fowler-Nordheim type EEPROM memory cell, a much higher voltage transistor is required for the select transistor, as compared to the cell itself and this requires a thicker layer of gate oxide. Additionally, the conventional technique has been to utilize a double poly process wherein the floating gates of the memory cells are fabricated in the first poly layer and the control gates of the memory cells are fabricated in the second poly layer, the second poly layer are also utilized to fabricate the row select transistors.

SUMMARY OF THE INVENTION

The present invention disclosed and claimed herein comprises a Flash EEPROM memory having a plurality of memory cells arranged in rows and columns on the face of a semiconductor substrate of a first conductivity type material. Each of the memory cells is operable to be programmed utilizing positive and negative voltages. Each of the memory cells is comprised of a floating gate memory cell having a floating gate overlying a channel region and separated therefrom by a tunnel oxide layer. Source and drain regions are disposed on either side of the channel region and a control gate is provided, which control gate is coupled to the floating gate. The control gate has at least a portion thereof defined by a region of second conductivity type material opposite to the first conductivity type material disposed in the face of the substrate. An isolation structure is provided to allow the control gate to have positive and negative voltages disposed thereon without substantial conduction from the control gate to the substrate.

In another aspect of the present invention, the floating gate memory cell has the channel region thereof formed on the face of the semiconductor substrate within an active moat. The source region is formed of second conductivity type material adjacent the channel region with the drain region also formed of second conductivity type material on the opposite side of the channel region. The floating gate is comprised of a strip of polycrystalline silicon material that overlies the portion of the channel region and is separated therefrom by a thin layer of tunnel oxide, the tunnel oxide layer allowing for Fowler-Nordheim tunneling therethrough. The control gate is comprised of a structure that is substantially coplanar with the floating gate with at least a portion thereof comprising a semiconductor region of the second conductivity type material formed on the face of the substrate. A coupling structure is provided for coupling the control gate to the floating gate to form the floating gate transistor.

In yet another aspect of the present invention, the control gate is formed in a control gate opening that is separate from the active region, in which a doped control gate region is formed with a second conductivity type material. The coupling structure is formed from a conductive strip that is integral and coplanar with the floating gate and extending over the doped control gate region. A layer of gate oxide is disposed between the poly strip and the control gate region. A contact area is provided in the doped control gate region to allow external connection thereto.

In a further aspect of the prevent invention, the isolation structure is comprised of a first isolation tank of the first conductivity type material disposed about the memory cells and biased with a voltage that will prevent forward biasing of the semiconductor junction between the doped control gate region and the first isolation tank. The first isolation tank is further disposed within the second isolation tank of the second conductivity type material. The second isolation tank is disposed at a voltage that will prevent forward biasing of the semiconductor junction between the first isolation tank and the second isolation tank.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
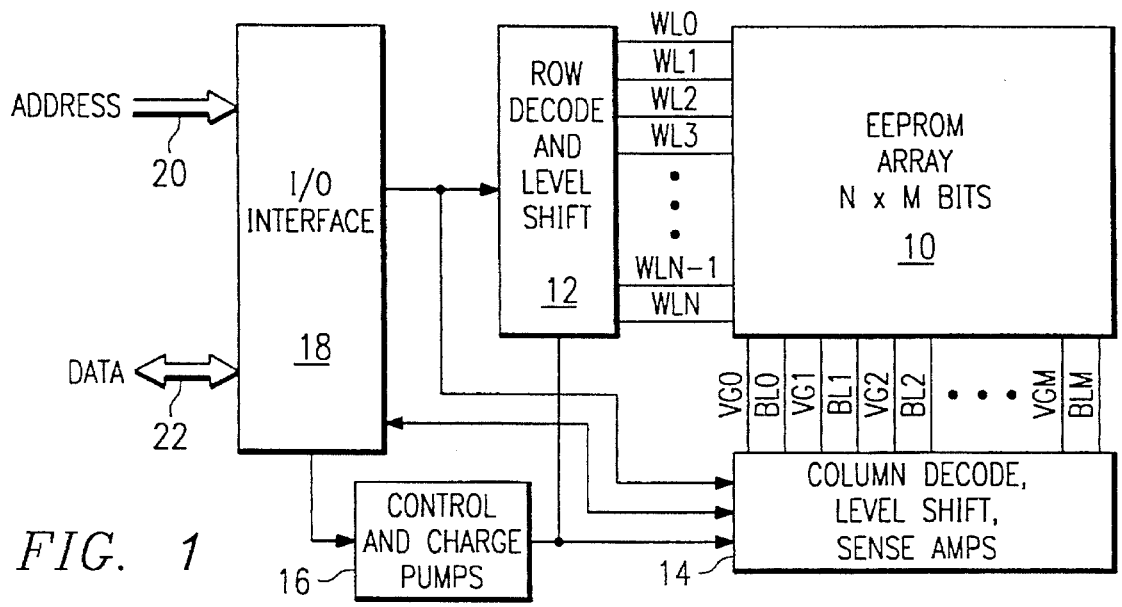
FIG. 1 illustrates a block diagram of the EEPROM.

Referring now to FIG. 1, there is illustrated a schematic block diagram of the architecture of an EEPROM memory which may stand alone as an independent integrated circuit, as well as being incorporated within a much higher level integrated circuit as a single module in that integrated circuit. The EEPROM memory includes an array 10 of memory cells which are arranged as N-rows and M-columns to provide an array of N×M bits. In a typical example, the array could be arranged to have 256 words with 8 bits per word, for a total of 2048 bits. These may be organized in an array of, for example, 32 rows by 64 columns, or 64 rows by 32 columns.

Each of the bits in the array 10 is associated with an EEPROM memory cell, as will be described hereinbelow. Each of the memory cells requires a dedicated Word Line, bit-line and Virtual Ground Line. A row decoder and level shifter 12 is provided for interfacing with the Word Lines to drive the Word Lines to the appropriate voltages. A column decoder, level shifter and sense amplifier section 14 is operable to drive the bit-lines and Virtual Ground Lines with the appropriate voltages and, during the Read operation, to attach the appropriate bit-lines to sense amplifiers and the appropriate Virtual Ground Lines to a desired voltage.

A block 16 includes circuitry for controlling the timing of the access to the EEPROM array 10 and charge pumps for providing control signals and appropriate voltages to the array 10, the row decode and level shift block 12 and the column decode, level shift and sense amplifier section 14. The control and charge pump block 16 is connected to an input/output (I/O) interface 18, which provides an interface with either the rest of the chip, or an external chip or device to receive address signals therefrom and also input and output data. The I/O interface 18 uses addresses from an address bus 20 and receives data from and transfers data to a data bus 22.

Figure 2:
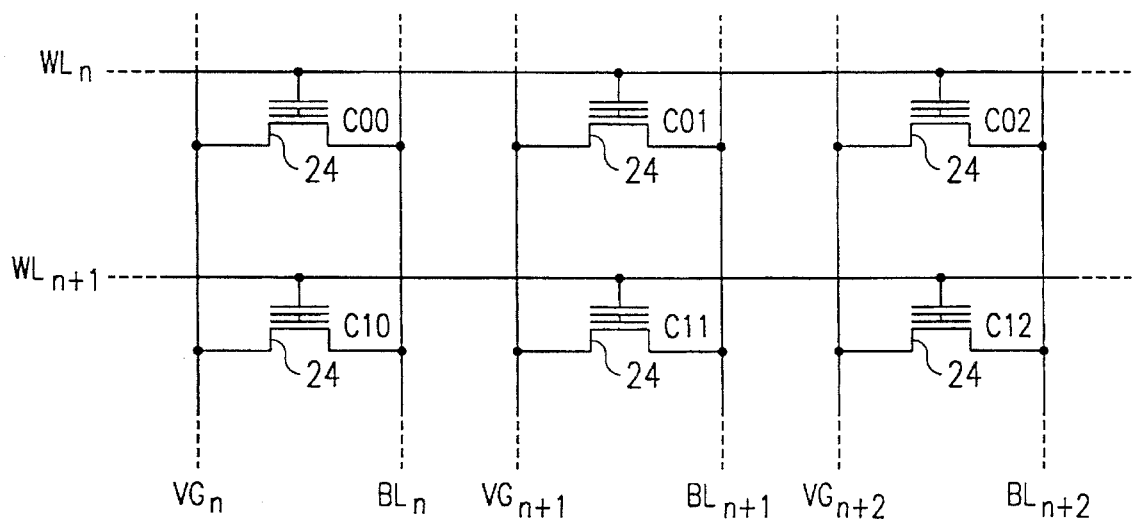
FIG. 2 illustrates a schematic diagram of the array.

Referring now to FIG. 2, there is illustrated a detailed diagram of the array. A plurality of EEPROM transistor cells 24 are provided which are arranged in rows of columns and incorporate the use of a floating gate transistor memory cell that utilizes Fowler-Nordheim tunneling for the programming operation thereof. A plurality of Word Lines 26 are provided, one associated with each row of memory cells 24, the Word Lines 26 connected to the control gates of the respective memory cells 24. A plurality of Column Lines 28 are provided, each associated with a column of the memory cells 24 and connected to the drains of the associated memory cells. Each of the Column Lines is designated as a Bit Line BL0, BL1 . . . BLN. Additionally, a plurality of Virtual Ground Lines 29 are provided, each associated with one column of the memory cells 24. Each of the Virtual Ground Lines 29 are connected to the sources of the associated memory cell transistors 24 in the associated column. The Virtual Ground Lines 29 are each labelled VG1, VG2 . . . VGN.

In the example of FIG. 2, there are illustrated two Word Lines $WL_{n-1}$ and $WL_{n+1}$, three Bit Lines $BL_n$, $BL_{n+1}$ and $BL_{n+2}$, and three Virtual Ground Lines $VG_n$, $VG_{n+1}$ and $VG_{n+2}$. Memory cell transistors 24 associated with the Word Line $WL_n$ are labelled C00, C01 and C02, for each of the respective Bit Lines $BL_n$–$BL_{n+2}$. Further, the three memory cell transistors 24 associated with the Word Line $WL_{n+1}$ are labelled C10, C11 and C12.

In order to Write to the cells, i.e., to negatively charge the floating gates, it is necessary to dispose the Word Lines 26 at a positive voltage, and the sources and drains of the memory cell transistor 24 at a negative voltage, to allow electrons to tunnel from the source side of each of the memory cells 24 to the floating gates thereof. This can be achieved in two ways. In one method, a high voltage level of approximately 18 volts can be disposed on all of the Word Lines 26, with the Column Lines 28 and Virtual Ground Lines 29 disposed at ground or zero volts. Alternately, and in the preferred embodiment, Word Lines 26 are disposed at a medium voltage of approximately 9 volts and the Column Lines 28 and Virtual Ground Lines 29 disposed at a negative medium voltage of –9 volts. In order to FLASH ERASE the cells, it is only necessary to dispose the Word Lines 26 at the negative medium voltage and the Column Lines 26 at the positive medium voltage.

In the programming mode of the present invention, the array is first subjected to a FLASH ERASE operation, and then a select cell subjected to a WRITE operation. In order to selectively WRITE one of the memory cell transistors 24, such that individual bit programming can be provided, it is necessary to dispose a positive voltage on the control gate of a select transistor relative to source and drain thereof. However, it is also important that the remaining voltages of the sources and drains of adjacent cells and other cells in the array be disposed at a voltage such that the charge on the floating gates thereof is not disturbed for unselected cells. For example, consider the memory cell transistor 24 labelled C11. The following Table 1 illustrates the voltages necessary for the FLASH WRITE, the WRITE the READ and FLASH ERASE operations.

TABLE 1

| MODE | $WL_n$ | $WL_{n+1}$ | $VG_n$ | $BL_n$ | $VG_{n+1}$ | $BL_{n+1}$ | $VG_{n+2}$ | $BL_{n+2}$ |
|---|---|---|---|---|---|---|---|---|
| Flash Write | +MV | +MV | MV | –MV | –MV | –MV | –MV | –MV |
|  | +HV | +HV | 0V | 0V | 0V | 0V | 0V | 0V |
| Write C11 | +HV/2 | +HV | Float | +HV/2 | Float | 0V | Float | +HV/2 |
| Read C11 | –Vr | +Vr | 0 | Float | 0v | Vs | 0 | Float |
| Flash Erase | –MV | –MV | Float | +MV | Float | +MV | Float | +MV | where:

HV=High Voltage (18 V)

MV=Medium Voltage (9 V)

Vr=Word Line Read Voltage (5 V ($V_{DD}$))

Vs=Bit Line Sense Voltage (1.2 V)

Initially, the Word Lines are all disposed at a positive medium voltage of, for example, 9 V and the Bit Lines disposed at a negative medium voltage of, for example, −9 V to remove all the negative charge from the floating gates of all of the memory cell transistors 24. The negative medium voltage may have the level thereof adjusted to ensure that the cells are not over erased, i.e., the threshold voltage thereof does not go negative. To Write to cell C11, the Word Line $WL_{n+1}$ is disposed at a high voltage of +18 V and the remaining Word Lines are disposed at a voltage of one half the high voltage, or +9 V. The Bit Line $BL_{n+1}$ is disposed at a value of zero volts, with the remaining Bit Lines disposed at a voltage of one half the high voltage, or +9 V, and all of the Virtual Ground Lines are allowed to float. Therefore, the tunnel diode of cell C11 will have a voltage of +18 volts disposed thereacross for the purpose of depleting charge from the associated floating gate without requiring the high node potentials necessary for a normal EEPROM cell. However, it is important to ensure that the other memory cells C10 and C12 in the same row having the control gates thereof attached to the Word Line $WL_{n+1}$, do not have the charge on the floating gates thereof disturbed, this referred to as a "write disturb" operation. This is achieved by disposing the Bit Lines associated with the non-selected cells in the row associated with Word Line $WL_{n+1}$ at the +9 V level, such that only +9 V is disposed across the associated tunnel diode of the non-selected cells. As such, the voltage is at an insufficient level to cause tunneling in the Fowler-Nordheim configuration.

With respect to the remaining cells on non-selected Word Lines, it can be seen that, since the voltage utilized on the Word Lines of the non-selected cells is one half the high voltage level, with the associated Bit Lines of the non-selected cells disposed at a zero voltage level, there will be a lower voltage across the tunnel diode as compared to that of the selected cell C11. As such, the voltage is at an insufficient level to cause tunneling in the Fowler-Nordheim configuration. Alternatively, the Word Line of C11 could be disposed at a positive medium voltage of, for example, +9 V for the WRITE operation and the remaining Word Lines at a voltage of 0 V, with the Bit Line of the selected cell disposed at a negative medium voltage of, for example, −9 V, and the Bit Lines of the non-selected cells disposed at a zero voltage level. The use of the negative voltage and the positive voltage as opposed to ground and a single positive programming voltage allows the array to operate in a bit-programming mode without requiring the use of a separate control transistors and, thus, allows for much smaller array size.

Figure 3:
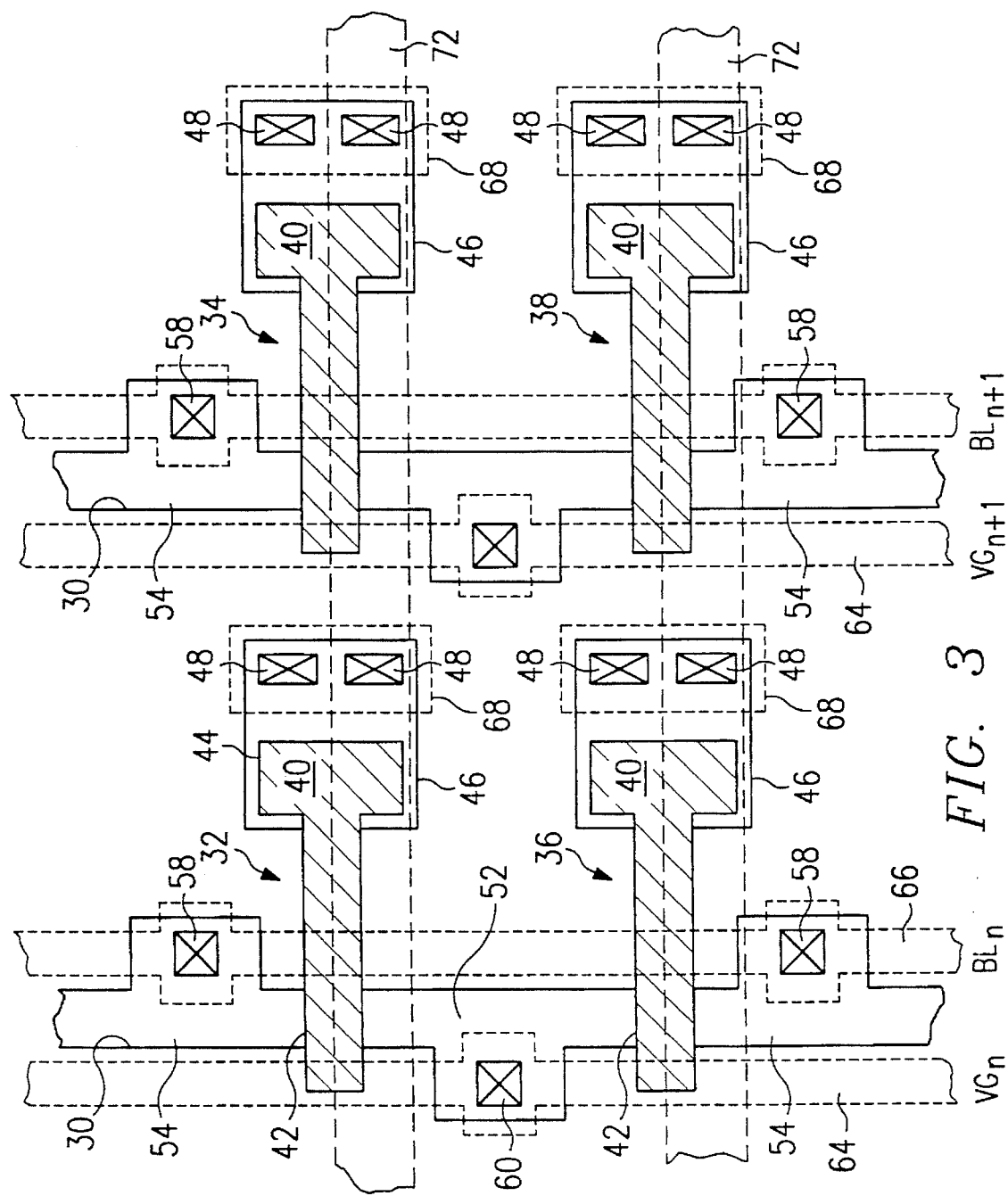
FIG. 3 illustrates a plan view of the cell layout for the array without the metal levels.

Referring now to FIG. 3, there is illustrated a layout for the array of FIG. 2. Each column of memory cells in the array has associated therewith a moat 30, the moat 30 providing the active region in which sources and drains of the transistors are formed separating channel regions of the transistors. There are four transistors 32, 34, 36 and 38, transistors 32 and 34 being in one row and transistors 36 and 38 being in another and adjacent row. The transistors 34 and 36 are in a common column and transistors 34 and 38 are in an adjacent and common column. Each of the transistors 32–38 has a floating gate 40 associated therewith which extends over the moat 30 at a tunnel portion 42 and then extends away from the moat 30 to provide a control gate portion 44. The tunnel portion 42 of the floating gate 40 is separated from the moat 30 by a layer of tunnel oxide having a thickness of approximately 100 Å. As will be described hereinbelow, the floating gate transistor is formed from a single poly layer. The control gate or the transistor is formed with a doped region 46 within the substrate. Each of the transistors 32–38 has associated therewith a control gate doped region 46 which underlies the control gate portion 44 of the floating gate 40. The doped region 46 is separated from the moat 30 by a field oxide region, the floating gate 40 extending over the field oxide region and the control gate doped region 46. The control gate portion 44 of the floating gate 40 is separated from the doped region 46 by a layer of oxide that is approximately 350 Å thick. The doped region 46 extends outward from the control portion 44 of the floating gate 40 and has contacts 48 associated therewith.

After the floating gate 40 has been formed, the exposed regions of the moat 30 are subjected to an implanting step wherein the N+ impurities are introduced into a relatively high concentration associated with a source/drain implant into the exposed regions of the moat 30 after the formation of source regions 52 and drain regions 54 along each column. The source regions 52 and drain regions 54 each are common to two adjacent transistors from two adjacent rows. Thereafter, contact areas 58 are formed in each of the drain regions 54 and contact regions 60 are formed in each of the source regions 52.

After formation of the floating gate 40 and the source/drain implants, a layer of interlevel oxide is disposed over the substrate and vias formed therein to expose the contact areas 48, 58 and 60. Thereafter, a first metal layer is disposed over the substrate and then patterned and etched to form Virtual Ground Lines 64, Bit Lines 66 and connection pads 68 for the control gates of the transistors, these contacting the vias 48. The Virtual Ground Lines are operable to be connected to the contact area 60 and the pads 68 are operable to be connected with the contact areas 48 and the control gates. A second layer of interlevel oxide is then disposed over the patterned first metal layer and then vias opened to the pad 68. A second metal layer is then disposed on the surface of the second interlevel oxide layer and then patterned to form row lines 72. The row lines 72 are disposed along each row of transistors and perpendicular to the Column Lines that include the Virtual Ground Lines 64 and Bit Line 66.

Figure 4:
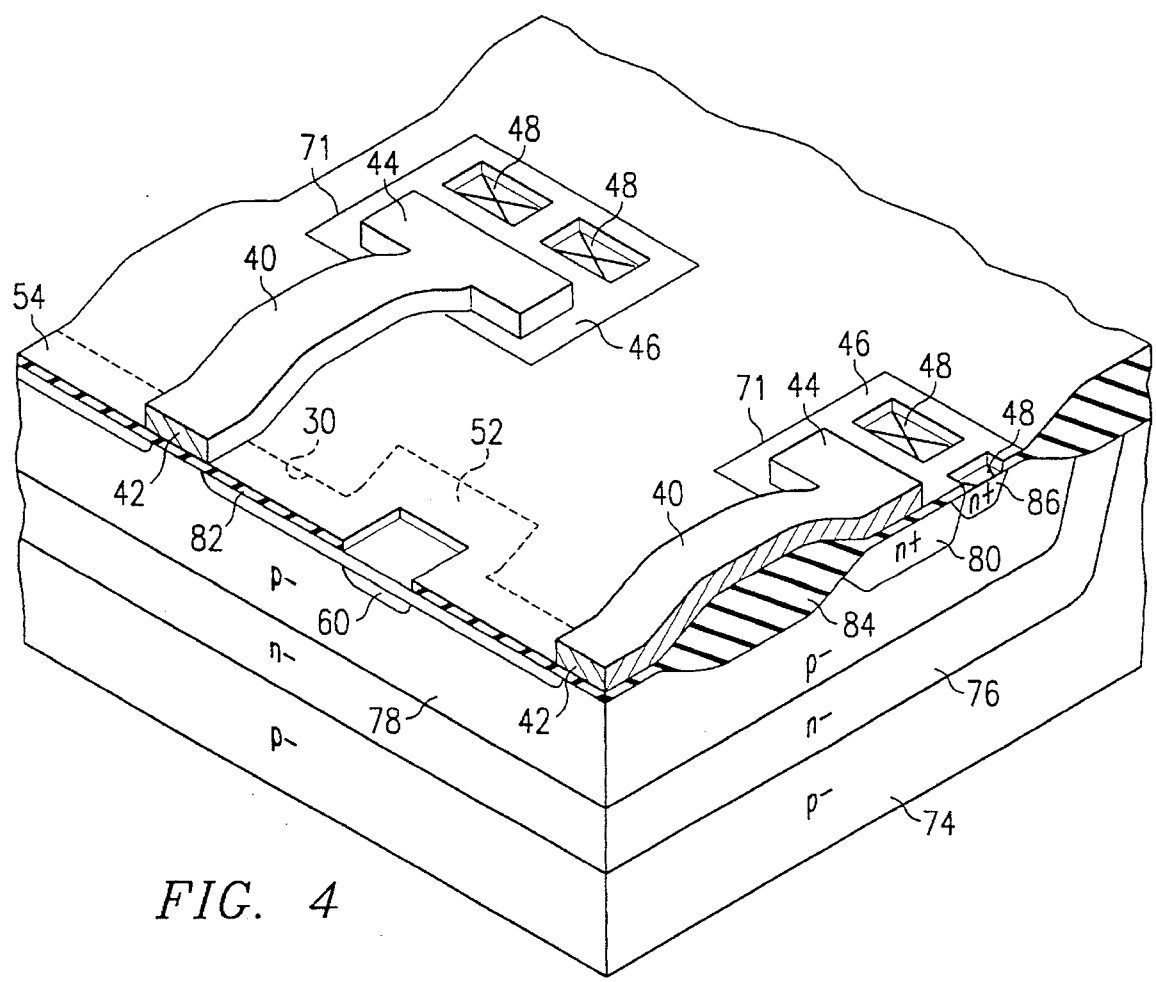
FIG. 4 illustrates a cross-sectional perspective view of two cells of the array.
Figure 4A:
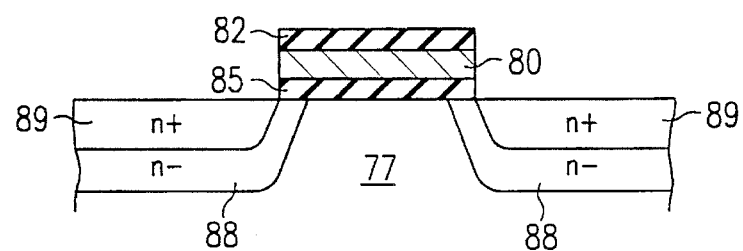
FIG. 4a illustrates a detail of the transistor of FIG. 4.

Referring now to FIG. 4, there is illustrated a cross-sectional cutaway perspective view of two of the transistors in the array. The highlights of the processing steps to form the transistors tip to the first poly level will be described hereinbelow. Initially, a P− substrate 74 is provided and then the surface thereof covered with an oxide layer and a nitride layer. The nitride layer is then patterned and etched to define the areas in which a high voltage N− tank 76 will be implanted. The N− tank implant is then conducted, preferably with phosphorous at a dose of about $2.5 \times 10^{12}$ ions/cm$^2$ at an energy of approximately 80 KeV. This creates the high voltage N− tank 76. A photoresist layer is then applied masking off the entire chip except for areas where a high voltage P− tank 78 is to be formed. This is achieved by implanting the surface with boron at about $1 \times 10^{14}$ ions/cm$^2$ and at an implantation energy of approximately 40 KeV. The substrate is then subjected to a driving step wherein the tanks 76 and 78 are driven into the substrate, the N− tank 76 driven deeper than the P− tank 78 and the N− tank 76 completely surrounding the P− tank 78 such that a PN junction is formed therebetween.

After the high voltage and low voltage tanks are formed, a moat pad oxide and a moat pad nitride (not shown) are then deposited, patterned and etched to form the moat 30. Thereafter, the channel stop implants are made and placed on the periphery of the cell. After the channel stop photoresist layer is stripped, a LOCOS oxide is grown on the surface of the epitaxial layer as separation for the active circuits. Also, the patterning step leaves an opening 71 for the control gate doped region 46. A layer of dummy oxide is then grown over the surface of the substrate covering the moat 30 and the opening 71 and then the substrate patterned to expose a portion of the opening 71. A phosphorous implant is then performed to form a control gate conductive region 80 in the region 70 within the opening 71, this being the control gate, and it also being noted that this is an N+region within a P− region. Additionally,, the substrate can be patterned and a threshold implant performed within the moat 30 to adjust the threshold of the transistors.

The dummy oxide layer is then removed and then a layer of insulator grown to a depth of, for example, 350 Å over the surface of the substrate. This oxide layer is stripped away in the area of the channels within the moat 30. A thin tunnel oxide layer is then grown to a depth of approximately 100 Å to provide a tunnel oxide layer 82.

After formation of the tunnel oxide layer, a first level poly layer is deposited on the substrate and then patterned and etched to form the floating gates 40. The control gate portion 44 of the floating gate 40 is separated from the control gate region 80 by a layer of oxide 84, which, as described above, has a thickness of approximately 350 Å.

Following the formation of the floating gate 46, a layer of oxide is formed over the entire surface to provide a conformal layer of oxide. This layer is then subjected to a directional or anisotropic etch using a plasma, as disclosed in U.S. Pat. No. 4,297,162, for example, to remove the oxide on all horizontal surfaces and leave sidewall oxide layers on the sidewalls of the floating gate 40. This is a conventional technique. Thereafter, phosphorous and arsenic implants are used to form the N+source regions 52 and drain regions 54 in addition to an N+contact region 86 adjacent to the control gate region 80. The N+contact region 86 has a much higher concentration than the control gate region 80 for the purpose of making a connection with the upper metal layers.

When the source/drain regions are formed, two steps are involved. This process is illustrated in detail in FIG. 4. After information of the floating gate over the channel region, the edges thereof are utilized as a mask for subsequent source/drain implants, which are performed with an arsenic implant to create heavily doped source/drain regions 89 on either side of the channel 77. This is followed by a phosphorous implant to a dosage of about $8 \times 10^{14}$ to $2 \times 10^{14}$ ions/cm$^2$. The substrate is then annealed at a temperature of approximately 950° C. to 1000° C. to cause lateral diffusion of the phosphorous implant, resulting in lightly doped regions 88 on either side of the channel 77. Each of the lightly doped regions 88 extend under the floating gate 40, such that a reach-through region is formed. As such, whenever a high voltage is disposed on the control gate implant 80 through the region 86 and a low voltage is disposed on either the source/drain implants 89, Fowler-Nordheim tunneling will occur at the reach-through region and electrons will flow therethrough to the floating gate 40 to negatively charge the floating gate 40, thereby raising the threshold voltage of the transistor.

After formation of the source/drain regions 89, a layer of oxide is then disposed over the substrate, followed by formation of the metal layers and the vias associated with the contact 60 and the contacts 48. This is described hereinabove.

Figure 5:
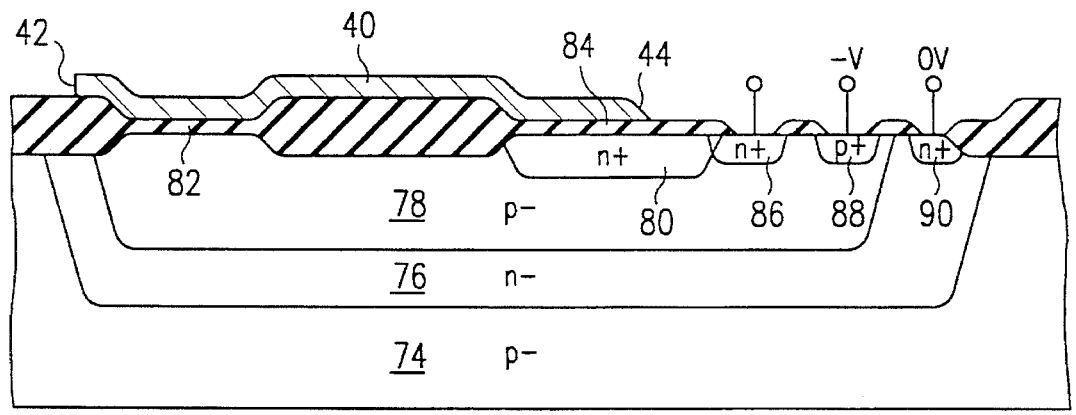
FIG. 5 illustrates a cross-sectional view taken through the floating gate that illustrates the high voltage tanks.

Referring now to FIG. 5, there is illustrated a cross-sectional diagram of the transistor taken lengthwise along the floating gate 40. In the diagram of FIG. 5, the P− tank 78 has a contact 88 associated therewith which is a P+ region and the N+tank 76 has a region 90 associated therewith which is an N+ region. A negative voltage is applied to the P+region 88, and a zero voltage is applied to the N+region 90. Therefore, by having a negative voltage on the P− tank 78, negative voltages can now be applied to the control gate implant region 80 without causing unwanted conduction to the substrate. Since the control gate implant 80 is an N+material, this will form a PN junction with the P− tank 78. As long as the P− tank 78 is at a voltage more negative than voltages applied to the control gate implant 80, no conduction will occur through the control gate. Additionally, the PN junction between the P− tank 78 and the N− tank 76 must also be reversed bias and, therefore, the zero voltage thereon will provide for this. The P− substrate 74 is typically disposed at a slight negative voltage also. By providing the P− tank 78 and the N− tank 76 and the associated voltages, a single level poly transistor can be provided wherein the control gate is formed within the substrate by an implant or diffused region which can utilize negative voltages during the programming operation.

Figure 6:
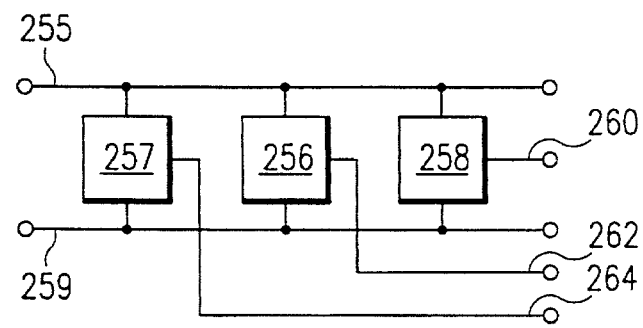
FIG. 6 illustrates a block diagram of the electrical circuit for providing the various voltage levels required by each cell.
Figure 7:
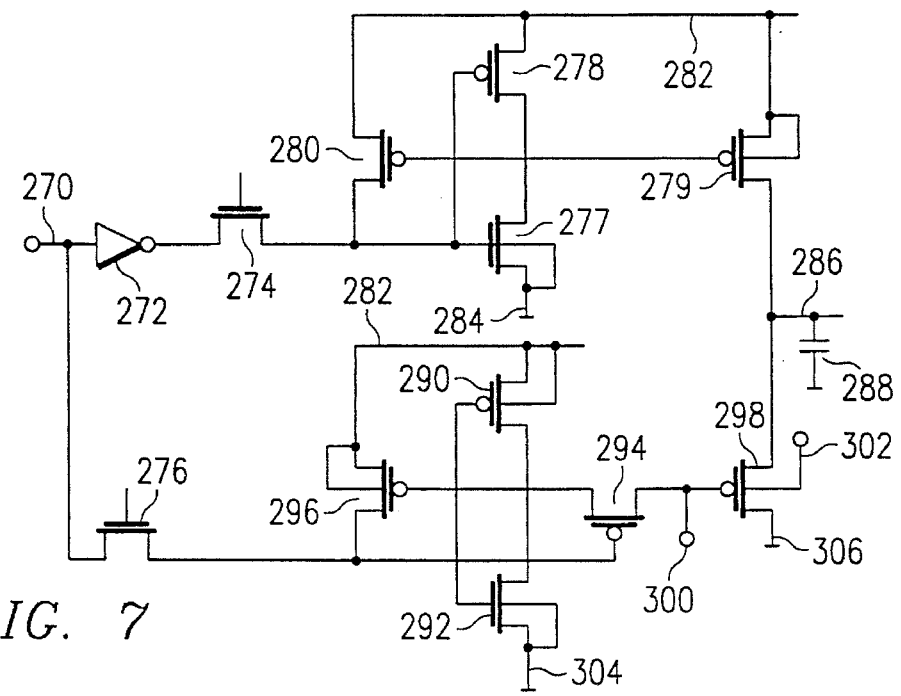
FIG. 7 illustrates a schematic diagram of a circuit for driving each word line of the array.

The circuitry required to drive the cells 24 illustrated in FIG. 2 is indicated by FIGS. 7 and 8. FIG. 6 shows in block diagram form the circuit required to produce the bipolar voltage levels required while FIG. 7 shows a switching circuit required to drive each line with a voltage required for a particular mode of operation.

In FIG. 6, a single voltage source of, for example, 5 volts is used as an input along line a 255 with a line 259 being ground or substrate voltage. Three charge pumps 257, 256 and 258 the design of which are well known in the art are coupled in parallel across lines 258 and 259. Each charge pump 257, 256 and 258 produces output voltages $-V_{gg}$, $-V_{pp}$ and $+V_{pp}$ on associated output lines 264, 262 and 260, respectively.

The circuit of FIG. 7 functions in response to input control signals received on input line 270 which are fed in parallel to an inverter 272 and through the source-to-drain of a field effect transistor 276 whose gate is at $V_{dd}$ or +5 volts. The inverter 272 output also passes through a field effect transistor 274 whose gate is at $V_{dd}$ or +5 V. The output from transistor 274 couples in parallel to the gates of an N− channel transistor 277 and a P− channel transistor 278 and to the drain of a P− channel transistor 280 to which the source of transistor 280 connects to the $V_{pp}$ line 282 and its gate connects to the drain of transistor 277. The source of transistor 277 is connected to ground at a $V_{ss}$ line 284 while the source of transistor 278 is connected to the $V_{pp}$ line 282.

The output from transistor 276 couples to the gates of transistors 290, 292 and 294, with transistors 290 and 294 being P− channel transistors. The drains of transistors 290 and 292 couple to the gate of transistor 296 and to the source of transistor 294. The drain of transistor 294 couples both to a $V_{gg}$ line 300 and to the gate of a P− channel transistor 298. Transistor 296 has the source thereof connected to the $V_{pp}$ line 282 and the drain thereof connected an output of transistor 276. The source of transistor 290 connects to the $V_{pp}$ line 282 while the source of transistor 292 is connected to the $V_{ss}$ line 104.

Output transistor 279 has the source thereof connected to the $V_{pp}$ line 282 and the drain thereof connected to the output line 286 while its complementary driver transistor 298 has the drain thereof connected to the $-V_{pp}$ line 306 and the source thereof connected to the line 286. Line 286 is charged and discharged by output capacitor 288 connected to $V_{ss}$.

In operation, a zero voltage input on input line 270 results in a positive signal at the output of inverter 272 which is applied to the gates of transistors 277 and 278. In response, transistor 277 turns on grounding the gates of transistors 279 and 280 and turning on both of the latter. Thus, transistor 279 in turning on connects the $V_{pp}$ line 282 to the output line 286. The charge pump 258 is operative to charge capacitor 288 to $+V_{pp}$. Simultaneously, transistor 280 couples $V_{pp}$ line 282 to the gates of transistors 277 and 278 thereby maintaining transistor 277 in an ON state and ensuring that there is no net voltage across the source-gate of transistor 278 so that the latter is cut off. Transistor 274 blocks the transmission of $V_{pp}$ to the output of inverter 272. Thus, capacitor 288 is charged through the channel resistance of transistor 279 to $V_{pp}$.

A zero output applied through transistor 276 turns on transistors 290 and 294 coupling $+V_{pp}$ on line 282 to the gate of transistor 298 and maintaining the latter OFF.

With an input signal at a logic "1", inverter 272 applies a logic "0" signal to the gates of transistors 277 and 278 turning on transistor 278 and applying $V_{pp}$ on line 282 to the gate of transistor 279. Transistor 279 is thus turned and/or maintained OFF.

An input signal at the logic "1" state turns on transistor 92 which applies zero volts to the source of transistor 292 and maintains the latter off. The $-V_{gg}$ and $-V_{pp}$ charge pumps 257 and 256 are then activated and transistor 298 turns on charging line 286 towards $-V_{pp}$. At the same time the $V_{pp}$ line 282 is tied to $V_{dd}$ lines 255.

Clearly, a variety of different voltages could be produced by the circuit of FIG. 6 depending upon the requirements. For the cells of FIG. 1, the combination +18 v, +9 V, −9 V, 3.0 V, 0 V and −3 V would be appropriate for the Word Line and Bit Line.

In summary, there has been provided a Flash EEPROM memory array utilizing a Flash EEPROM cell fabricated from a single poly process. The floating gate of the EEPROM cell is formed from a first poly layer and has two portions, a first portion for overlying the channel region of the transistor and separated therefrom by a thick tunnel oxide. A second portion extends away from the moat and over a control gate implant, which implant is separated from the moat by a thick layer of oxide. The control gate is connected through a contact to an upper metal layer. The programming operation allows for bit programming of individual cells through the use of negative and positive medium voltages to allow for negative voltages on the control gate implant region. The control gate implant is disposed within a tank of opposite conductivity material such that the PN junction therebetween is always reverse biased and no conduction occurs therethrough. This region is further encompassed within another region of opposite conductivity type from that of the substrate to prevent conduction through this region to the substrate.

Although the preferred embodiment has been described in detail, it should be understood that various changes, substitutions and alterations can be made therein without departing from the spirit and scope of the invention as defined by the appended claims.

What is claimed is:

1. A Flash EEPROM memory having a memory array of EEPROM memory cells arranged in rows and columns on the face of a semiconductor substrate of a first conductivity type material and operable to be programmed with positive and negative voltages, the memory cells each comprising:

a channel region of first conductivity type material formed in the face of the substrate within an active moat region;

a source region of second conductivity type material adjacent to the first conductivity type material and disposed on one side of said channel region;

a drain region of said second conductivity material disposed in said moat region on said opposite side of said channel region from said source region;

a floating gate overlying a portion of said channel region;

a tunnel oxide layer disposed between said floating gate and said channel region to allow for Fowler-Nordheim electron tunneling therethrough;

a control gate comprising a semiconductor region of the second conductivity type material formed on the face of the substrate and separated from said moat region and coupling electrically directly to said floating gat;

a coupling structure for coupling said control gate to said floating gate to form a floating gate transistor; and an isolation structure for allowing said control gate to have positive and negative voltages disposed thereon without substantial conduction from the control gate to the substrate, wherein said isolation structure comprises a first isolation tank of first conductivity type material disposed about the memory cell and operable to be biased at a voltage potential that will prevent forward biasing of the semiconductor junction between said first isolation tank and said doped control gate region, and a second conductivity type material disposed about said first tank and disposed at a voltage that will prevent forward biasing of the semiconductor junction between said first isolation tank and said second isolation tank.

2. A Flash EEPROM memory having a memory array of EEPROM memory cells arranged in rows and columns on the face of a semiconductor substrate of a first conductivity type material and operable to be programmed with positive and negative voltages the memory cell comprising:

a floating gate memory cell having a floating gate and a channel region separating a source region and a drain region, and a control gate coupled to said floating gate, said control gate comprising a doped control gate region of second conductivity type material opposite the first conductivity type material in the face of the semiconductor substrate and coupling electrically directly to said floating gate; and an isolation structure for allowing said control gate to have positive and negative voltages disposed thereof, without substantial conduction from the control gate to the substrate, wherein said isolation structure comprises a first isolation tank of first conductivity type material disposed about the memory cell and operable to be biased at a voltage potential that will prevent forward biasing of the semiconductor junction between said first isolation tank and said doped control gate region, and a second isolation tank of second conductivity type material disposed about said first tank and disposed at a voltage that will prevent forward biasing of the semiconductor junction between said first isolation tank and said second isolation tank.

* * * * *